US011699469B2

(12) United States Patent
Kang et al.

(10) Patent No.: US 11,699,469 B2
(45) Date of Patent: Jul. 11, 2023

(54) OPERATING METHOD OF HOST DEVICE AND MEMORY DEVICE AND MEMORY SYSTEM

(71) Applicant: SAMSUNG ELECTRONICS CO., LTD., Suwon-si (KR)

(72) Inventors: Young San Kang, Yongin-si (KR); Jeong Hur, Hwaseong-si (KR); Walter Jun, Seoul (KR); Kwang Won Park, Suwon-si (KR); Kyoung Back Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 8 days.

(21) Appl. No.: 17/400,368

(22) Filed: Aug. 12, 2021

(65) Prior Publication Data

US 2022/0165314 A1    May 26, 2022

(30) Foreign Application Priority Data

Nov. 23, 2020    (KR) .......................... 10-2020-0157332

(51) Int. Cl.
*G11C 7/00*    (2006.01)
*G11C 7/10*    (2006.01)

(52) U.S. Cl.
CPC .......... *G11C 7/1096* (2013.01); *G11C 7/1045* (2013.01); *G11C 7/1057* (2013.01); *G11C 7/1069* (2013.01); *G11C 7/1084* (2013.01)

(58) Field of Classification Search
CPC .................................................. G11C 7/1084
USPC .................................................... 365/189.05
See application file for complete search history.

(56) References Cited

U.S. PATENT DOCUMENTS

| | | |
|---|---|---|
| 4,475,210 A | 10/1984 | Couch |
| 8,990,491 B1 | 3/2015 | Xu |
| 9,836,121 B2 | 12/2017 | Wu et al. |
| 10,014,907 B2 | 7/2018 | Choi et al. |
| 10,083,736 B1 | 9/2018 | Jeter et al. |
| 10,313,068 B1 | 6/2019 | Ahmed et al. |
| 2016/0209462 A1 | 7/2016 | Choi et al. |
| 2018/0059954 A1 | 3/2018 | Hur et al. |
| 2019/0004984 A1 | 1/2019 | Lee et al. |
| 2019/0034364 A1* | 1/2019 | Lee .......................... G06F 3/061 |
| 2019/0332321 A1 | 10/2019 | Chen |
| 2019/0391761 A1 | 12/2019 | Brief et al. |

OTHER PUBLICATIONS

Communication dated Apr. 7, 2022 issued by the European Patent Office in counterpart European Application No. 21202412.9.
Communication dated Apr. 22, 2022 issued by the European Patent Office in counterpart European Application No. 21 202 412.9.

* cited by examiner

*Primary Examiner* — Hoai V Ho
(74) *Attorney, Agent, or Firm* — Sughrue Mion, PLLC

(57) ABSTRACT

Provided are an operating method of a host device, an operating method of a memory device, and a memory system. The operating method of a host device includes transmitting a request command for performing an eye-opening monitor (EOM) operation to a memory device, transmitting a parameter for performing the EOM operation to the memory device, transmitting pattern data for performing the EOM operation to the memory device, and receiving a first response signal including a result of the EOM operation performed based on the parameter and the pattern data from the memory device.

21 Claims, 13 Drawing Sheets

| Byte \ Bit | 7 | 6 | 5 | 4 | 3 | 2 | 1 | 0 |
|---|---|---|---|---|---|---|---|---|
| 0 | Operation code (3Bh) | | | | | | | |
| 1 | Reserved | | | Mode = 1Fh | | | | |
| 2 | BUFFER ID | | | | | | | |
| 3 | (MSB) | | | | | | | |
| 4 | BUFFER OFFSET | | | | | | | |
| 5 | | | | | | | | (LSB) |
| 6 | (MSB) | | | | | | | |
| 7 | PARAMETER LIST LENGTH | | | | | | | |
| 8 | | | | | | | | (LSB) |
| 9 | Control = 00h | | | | | | | |

FIG. 10

| MODE | DESCRIPTION |
|---|---|
| 00h | Not used in UFS |
| 01h | Vendor Specific |
| 02h | Data |
| ... | Not used in UFS |
| 0Eh | Download microcode with offsets, save and defer active |
| ... | Not used in UFS |
| 1Dh | Reserved |
| 1Eh | Reserved |
| 1Fh | EYE OPEN MONITOR |

FIG. 11

| Byte \ Bit | 7 | 6 | 5 | 4 | 3 | 2 | 1 | 0 | |
|---|---|---|---|---|---|---|---|---|---|
| 0 | (MSB) | | | | | | | | ⎫ |
| 1 | | | EOM DATA LENGTH (N-11) | | | | | | |
| 2 | | | | | | | | (LSB) | |
| 3 | PHASE SELECT ||||||||  EDH |
| 4 | VREF CONTROL |||||||| |
| 5 | NUMBER OF SAMPLING |||||||| |
| 6 | VREF RESOLUTION |||| PHASE RESOLUTION (GEAR) |||| |
| 7 | Reserved = 00h |||||||| |
| 8 | Reserved = 00h |||||||| |
| 9 | Reserved = 00h |||||||| |
| 10 | Reserved = 00h |||||||| |
| 11 | Reserved = 00h |||||||| ⎭ |

| | | |
|---|---|---|
| 12 | Data[0] | ⎫ |
| ... | ... |  EDP |
| N | Data[EOM DATA LENGTH - 1] | ⎭ |

FIG. 13

| Byte \ Bit | 7 | 6 | 5 | 4 | 3 | 2 | 1 | 0 | |
|---|---|---|---|---|---|---|---|---|---|
| 0 | (MSB) | | | | | | | | |
| 1 | | | | Total Data Length (N+1) | | | | | EDH |
| 2 | | | | | | | | (LSB) | |
| 3 | (MSB) | | | | | | | | |
| 4 | | | | EOM Data Pattern Length (N-11) | | | | | |
| 5 | | | | | | | | (LSB) | |
| 6 | | | | Timing Step | | | | | |
| 7 | | | | Voltage Step | | | | | |
| 8 | | | | Number of Sampling | | | | | |
| 9 | | | | Timing Offset | | | | | |
| 10 | | | | Voltage Offset | | | | | |
| 11 | | | | Reserved 1 | | | | | |
| 12 | | | | | | | | | |
| 13 | | | | | | | | | |
| 14 | | | | | | | | | |
| 15 | | | | | | | | | |
| 16 | | | | | | | | | |
| 17 | | | | | | | | | |
| 18 | | | | EOM Data Pattern | | | | | EDP |
| 19 | | | | | | | | | |
| 20 | | | | | | | | | |
| 21 | | | | | | | | | |
| 8 | | | | | | | | | |
| N-2 | | | | | | | | | |
| ... | | | | | | | | | |
| N | | | | | | | | | |

FIG. 14

Response UPIU

| 0 | 1 | 2 | 3 |
|---|---|---|---|
| xx10 0001b | Flags | LUN | Task Tag |
| 4 | 5 | 6 | 7 |
| iID \| Command Set Type | Reserved | Response | Status |
| 8 | 9 | 10 | 11 |
| Total EHS Length (00h) | Device Information | Data Segment Length | |
| 12 (MSB) | 13 | 14 | 15 (LSB) |
| Residual Transfer Count | | | |
| 16 | 17 | 18 | 19 |
| Reserved | | | |
| 20 | 21 | 22 | 23 |
| Reserved | | | |
| 24 | 25 | 26 | 27 |
| Reserved | | | |
| 28 | 29 | 30 | 31 |
| Reserved | | | |
| Header E2ECRC (omit if HD=0) | | | |
| k | k+1 | k+2 | k+3 |
| Sense Data Length | | Sense Data[0] | Sense Data[1] |
| k+4 | k+5 | k+6 | k+7 |
| Sense Data[2] | Sense Data[3] | Sense Data[4] | Sense Data[5] |
| ... | ... | ... | ... |
| k+16 | k+17 | k+18 | k+19 |
| Sense Data[14] | Sense Data[15] | Sense Data[16] | Sense Data[17] |
| Data E2ECRC (omit if DD=0) | | | |

NOTE 1 k = 32 if HD = 0.

OPERATING METHOD OF HOST DEVICE AND MEMORY DEVICE AND MEMORY SYSTEM

CROSS-REFERENCE TO THE RELATED APPLICATION(S)

This application claims priority from Korean Patent Application No. 10-2020-0157332 filed on Nov. 23, 2020 in the Korean Intellectual Property Office, the disclosure of which is herein incorporated by reference in its entirety.

BACKGROUND

1. Field

The disclosure relates to an operating method of a host device and a memory device and a memory system.

2. Description of the Related Art

To detect quality characteristics of a signal transmitted and received through a channel, an eye-opening monitor (EOM) is used. To measure the eye of a signal received at a signal receiving terminal (e.g., a receiver of a memory device) of a memory system, a memory device and an external device may be used to measure the eye of a signal received by the memory device.

However, in this case, a signal line through which measurement is performed and a signal line through which a signal is actually received by the memory device are different. Accordingly, the measurement result may be inaccurate, and the measurement method is not simple.

SUMMARY

Aspects of the disclosure provide an operating method of a host device for easily performing a reliable eye-opening monitor (EOM) operation.

Aspects of the disclosure also provide an operating method of a memory device for easily performing a reliable EOM operation.

Aspects of the disclosure also provide a memory system for easily performing a reliable EOM operation.

It should be noted that objects of the disclosure are not limited to the above-described objects, and other objects of the disclosure will be apparent to those skilled in the art from the following descriptions.

According to some aspects of the disclosure, an operating method of a host device includes transmitting, by the host device, a request command for performing an EOM operation to a memory device, transmitting, by the host device, a parameter for performing the EOM operation to the memory device, transmitting, by the host device, pattern data for performing the EOM operation to the memory device, and receiving, by the host device, a first response signal including a result of the EOM operation performed based on the parameter and the pattern data from the memory device.

According to some other aspects of the disclosure, an operating method of a memory device includes receiving, by the memory device, a request command for performing an EOM operation from a host device, receiving, by the memory device, a parameter for performing the EOM operation from the host device, receiving, by the memory device, pattern data for performing the EOM operation from the host device, performing, by the memory device, the EOM operation based on the parameter and the pattern data, and transmitting a first response signal including a result of performing the EOM operation to the host device.

According to some other aspects of the disclosure, a memory system includes a host device including a host controller and a memory device including a device controller and an EOM. The host controller is configured to transmit a request command for performing an EOM operation to the memory device, transmit a parameter for performing the EOM operation to the memory device, transmit pattern data for performing the EOM operation to the memory device, and receive a first response signal including a result of the EOM operation performed based on the parameter and the pattern data from the memory device.

BRIEF DESCRIPTION OF THE DRAWINGS

The above and other aspects and features of the disclosure will become more apparent by describing example embodiments thereof in detail with reference to the attached drawings, in which:

FIG. 8 is a sequence diagram illustrating an operation of a memory system according to some example embodiments;

FIGS. 9 to 14 are diagrams illustrating an operation of a memory system according to some example embodiments;

DETAILED DESCRIPTION

Hereinafter, example embodiments according to the disclosure will be described with reference to the accompanying drawings.

Figure 1:
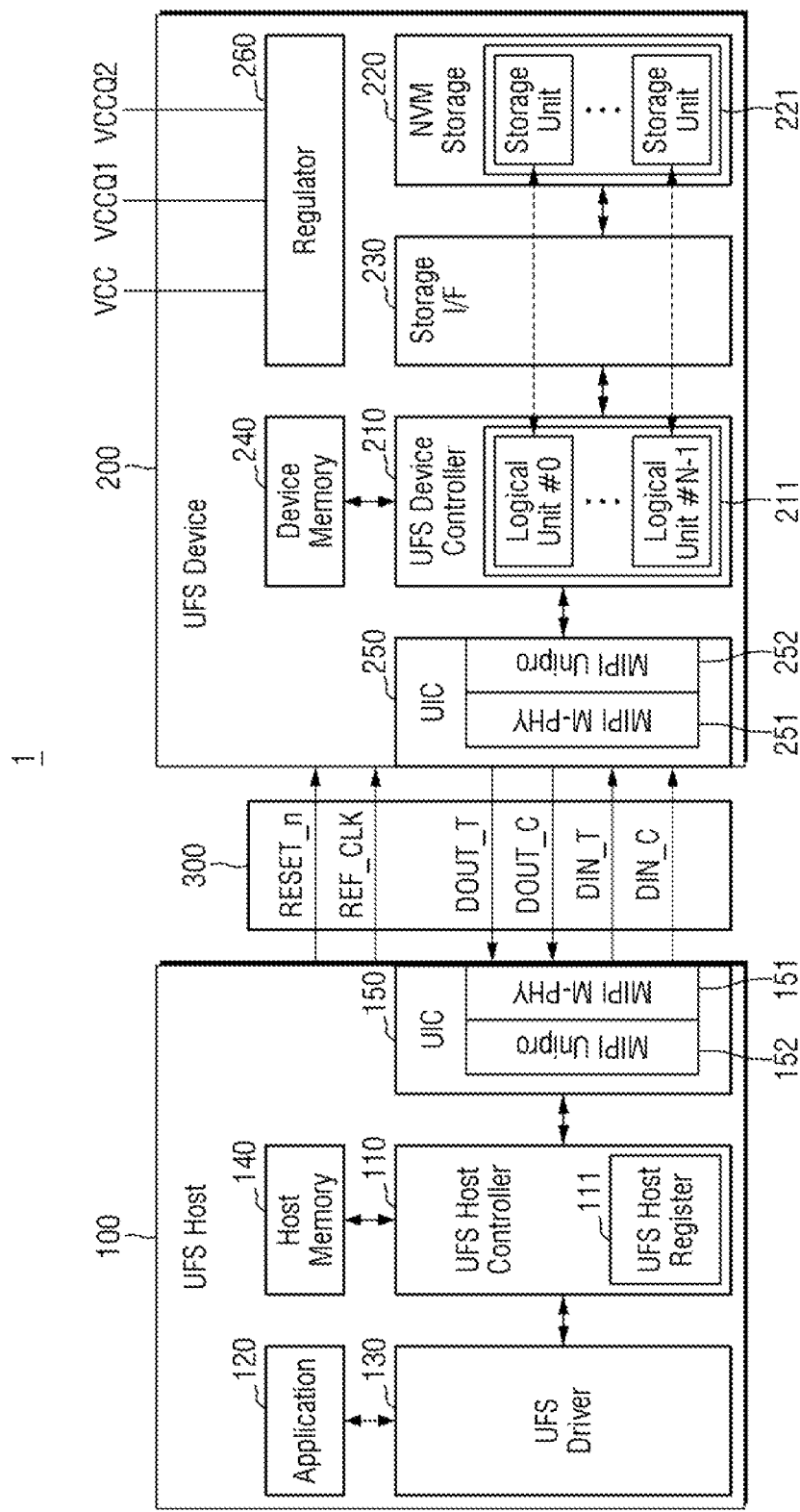
FIG. 1 is a block diagram of a memory system according to some example embodiments.
Figure 2:
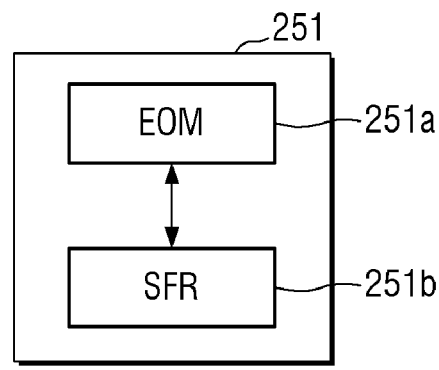
FIG. 2 is a block diagram of a mobile industry processor interface (MIPI) M-PHY of FIG. 1.
Figure 3:
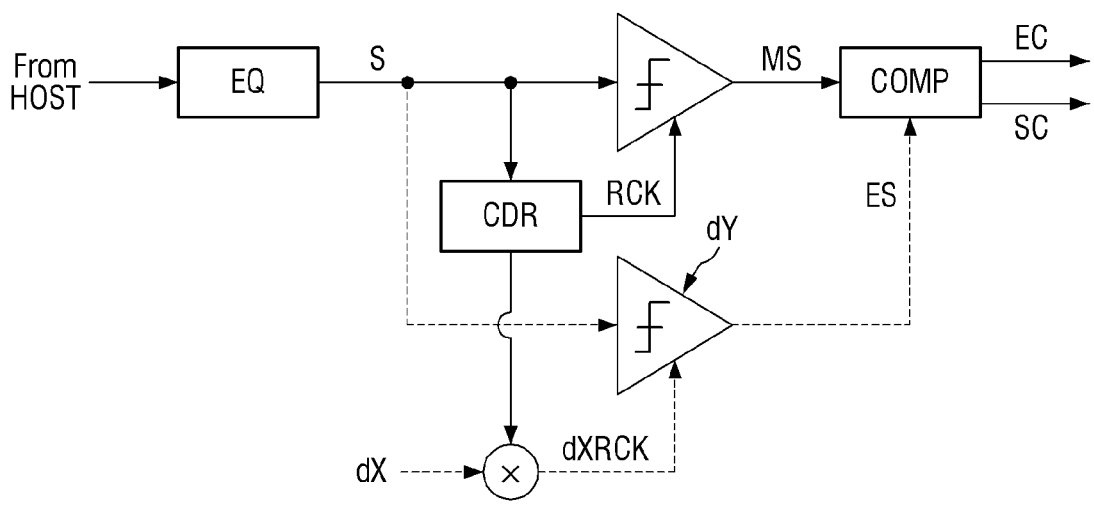
FIGS. 3 and 4 are diagrams illustrating an eye-opening monitor (EOM) of FIG. 2.
Figure 4:
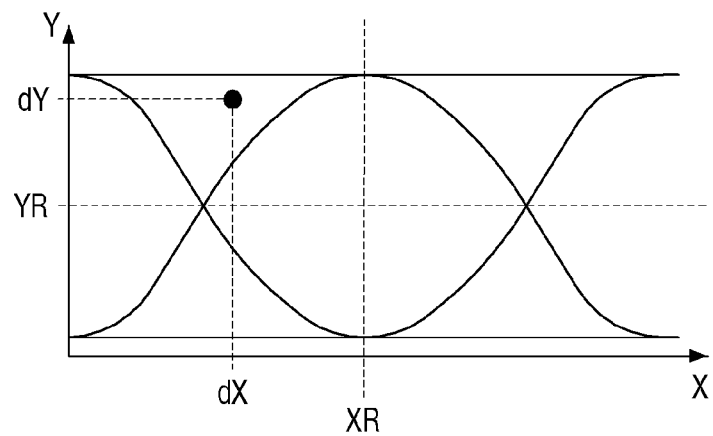

FIG. 1 is a block diagram of a memory system according to some example embodiments of the disclosure. FIG. 2 is a block diagram of a mobile industry processor interface (MIPI) M-PHY of FIG. 1. FIGS. 3 and 4 are diagrams illustrating an eye-opening monitor (EOM) of FIG. 2.

A memory system according to the disclosure will be described below with an example of a system conforming to a universal flash storage (UFS) standard announced by the Joint Electron Device Engineering Council (JEDEC). However, the disclosure is not limited thereto, and any aspect of the memory system may be modified within the scope of the disclosure.

Referring to FIG. 1, a UFS system 1 may include a host device 100, a memory device 200, and an UFS interface 300.

The host device 100 and the memory device 200 may be connected to each other through the UFS interface 300. In some example embodiments, the host device 100 may be implemented as a part of an application processor.

The host device 100 may include a UFS host controller 110, an application 120, a UFS driver 130, a host memory 140, and a UFS interconnect (UIC) layer 150.

The memory device 200 may include a UFS device controller 210, a nonvolatile storage 220, a storage interface 230, a device memory 240, a UIC layer 250, and a regulator 260.

The nonvolatile storage 220 may include a plurality of memory units 221. The memory units 221 may include vertical (V)-NAND flash memories having a two-dimensional (2D) structure or a three-dimensional (3D) structure or include other kinds of nonvolatile memories such as phase-change random access memories (PRAMs) and/or resistive random access memories (RRAMs).

The UFS device controller 210 and the nonvolatile storage 220 may be connected to each other through the storage interface 230. The storage interface 230 may be implemented to comply with a standard protocol such as Toggle or the open NAND flash interface (ONFI). The operations between the UFS device controller 210 and the nonvolatile storage 220 using Toggle will be described later.

The application 120 may include a program which needs to communicate with the memory device 200 to use a function of the memory device 200. The application 120 may transmit an input-output request (IOR) to the UFS driver 130 for an input and/or output for the memory device 200. The IOR may include a data read request, a data write request, a data erase request, and/or the like but is not necessarily limited thereto.

The UFS driver 130 may manage the UFS host controller 110 through a UFS-host controller interface (HCI). The UFS driver 130 may convert the IOR generated by the application 120 into a UFS command defined in the UFS standard and transmit the converted UFS command to the UFS host controller 110. One IOR may be converted into a plurality of UFS commands. Basically, the UFS commands may be commands defined in a small computer small interface (SCSI) standard but may be commands exclusively for the UFS standard.

The UFS host controller 110 may transmit the UFS command converted by the UFS driver 130 to the UIC layer 250 of the memory device 200 through the UIC layer 150 and the UFS interface 300. In this process, a UFS host register 111 of the UFS host controller 110 may serve as a command queue (CQ).

The UIC layer 150 of the host device 100 may include an MIPI M-PHY 151 and an MIPI UniPro 152, and the UIC layer 250 of the memory device 200 may also include an MIPI M-PHY 251 and an MIPI UniPro 252.

Referring to FIG. 2, the MIPI M-PHY 251 may include an EOM 251a and a special function register (SFR) 251b.

The EOM 251a may measure quality of a signal received from the host device 100 under a specific offset condition using the SFR 251b.

Specifically, referring to FIGS. 2 to 4, the EOM 251a may include a main path displayed as a solid line in FIG. 3 and an EOM path displayed as a broken line in FIG. 3.

In the main path, a clock RCK may be recovered from a signal S, which is received from the host device 100 and passed through an equalizer EQ, using a clock recovery circuit CDR, and data of the signal S is extracted using the recovered clock RCK such that a main path signal MS is generated. Then, the main path signal MS may be transmitted to a comparator COMP.

In the EOM path, a clock dXRCK is generated by reflecting a specific offset value dX in the clock RCK recovered from the signal S, which is received from the host device 100 and passed through the equalizer EQ, and data of the signal S is extracted to reflect the specific offset value dY using the clock dXRCK such that an EOM path signal ES is generated. Then, the EOM path signal ES may be transmitted to the comparator COMP.

For example, the main path signal MS may be data extracted under a reference condition (XR, YR) of FIG. 4, and the EOM path signal ES may be data extracted under an offset condition (dX, dY) of FIG. 4.

The comparator COMP may not output an error count signal EC when the EOM path signal ES is recognized as the same signal as the main path signal MS, and may output the error count signal EC when the EOM path signal ES is recognized as a different signal from the main path signal MS. Also, the comparator COMP may output a sampling count signal SC every time a sampling is performed.

In some example embodiments, the offset value dX may include a time offset value, a phase offset value, etc., and the offset value dY may include a voltage offset value and the like. However, example embodiments are not limited thereto.

In some example embodiments, an error count value according to the offset value dX, the offset value dY, and the error count signal EC, sampling number information according to the sampling count signal SC, etc. may be stored in the SFR 251b, but example embodiments are not limited thereto. Detailed operations of the EOM 251a will be described later.

Referring back to FIG. 1, the UFS interface 300 may include a line for transmitting a reference clock REF_CLK, a line for transmitting a hardware reset signal RESET_n for the memory device 200, one pair of lines for transmitting a pair of differential input signals DIN_T and DIN_C, and one pair of lines for transmitting a pair of differential output signals DOUT_T and DOUT_C.

A frequency value of the reference clock REF_CLK provided from the host device 100 to the memory device 200 may have one of four values of 19.2 MHz, 26 MHz, 38.4 MHz, and 52 MHz but is not necessarily limited thereto. Even during an operation, that is, while data is transmitted and received between the host device 100 and the memory device 200, the host device 100 may change the frequency value of the reference clock REF_CLK.

The memory device 200 may generate clocks having various frequencies from the reference clock REF_CLK received from the host device 100 using a phase-locked loop (PLL) and the like. Also, the host device 100 may set a data rate value between the host device 100 and the memory device 200 through the frequency value of the reference clock REF_CLK. In other words, the data rate value may be determined depending on the frequency value of the reference clock REF_CLK.

The UFS interface 300 may support multiple lanes, and each of the lanes may be implemented as a pair of differential lanes. For example, the UFS interface 300 may include one or more receive lanes and one or more transmit lanes. In FIG. 1, one pair of lines for transmitting the pair of differential input signals DIN_T and DIN_C may be the receive lanes, and one pair of lines for transmitting the pair of differential output signals DOUT_T and DOUT_C may be the transmit lanes. Although FIG. 1 shows one pair of transmit lanes and one pair of receive lanes, the number of transmit lanes and the number of receive lanes may be variously changed.

The receive lanes and the transmit lanes may transmit data in a serial communication manner, and full-duplex communication is possible between the host device 100 and the memory device 200 due to a structure in which the receive lanes are separate from the transmit lanes. In other words, the memory device 200 may transmit data to the host device 100 through the transmit lanes even while receiving data from the host device 100 through the receive lanes. Also, control data, such as a command from the host device 100 to the memory device 200, and user data, which will be stored in the nonvolatile storage 220 of the memory device 200 or read from the nonvolatile storage 220 by the host device 100, may be transmitted through the same lane. Accordingly, an additional lane for transmitting data between the host device 100 and the memory device 200 is not needed in addition to one pair of receive lanes and one pair of transmit lanes.

The UFS device controller 210 of the memory device 200 may control the overall operation of the memory device 200.

The UFS device controller 210 may manage the nonvolatile storage 220 through logical units (LUs) 211 which are logical data storage units. The number of LUs 211 may be, for example, eight, but example embodiments are not limited thereto.

The UFS device controller 210 may include a flash translation layer (FTL) and translate a logical data address received from the host device 100, for example, a logical block address (LBA), into a physical data address, for example, a physical block address (PBA) or a physical page number (PPN), using address mapping information of the FTL. In the UFS system 1, logical blocks for storing user data may have a size in a certain range. For example, the minimum size of logical blocks may be set to 4 k bytes When a command from the host device 100 is input to the memory device 200 through the UIC layer 250, the UFS device controller 210 may perform an operation according to the input command. When the operation is completed, the UFS device controller 210 may transmit a completion response to the host device 100.

As an example, when the host device 100 is to store user data in the memory device 200, the host device 100 may transmit a data write command to the memory device 200. When a "ready-to-transfer" response is received from the memory device 200, the host device 100 may transmit the user data to the memory device 200. The UFS device controller 210 may temporarily store the received user data in the device memory 240 and store the user data temporarily stored in the device memory 240 to a selected location in the nonvolatile storage 220 based on address mapping information of the FTL.

As another example, when the host device 100 is to read user data stored in the memory device 200, the host device 100 may transmit a data read command to the memory device 200. The UFS device controller 210 that receives the command may read the user data from the nonvolatile storage 220 based on the data read command and temporarily store the read user data in the device memory 240. In this read process, the UFS device controller 210 may detect and correct an error in the read user data using an embedded error correction code (ECC) circuit (not shown). Also, the UFS device controller 210 may transmit the user data temporarily stored in the device memory 240 to the host device 100.

In addition, the UFS device controller 210 may further include an advanced encryption standard (AES) circuit (not shown). The AES circuit may encrypt or decrypt data input to the UFS device controller 210 using a symmetric-key algorithm.

The host device 100 may sequentially store commands to be transmitted to the memory device 200 in the UFS host register 111, which may function as a CQ, and sequentially transmit the commands to the memory device 200. At this time, even while a previously transmitted command is still being processed by the memory device 200, that is, even before the host device 100 is notified that the previously transmitted command has been completely processed by the memory device 200, the host device 100 may transmit a subsequent command waiting in the CQ to the memory device 200. Accordingly, the memory device 200 may also receive the subsequent command from the host device 100 even while processing the previously received command. The maximum number of commands that may be stored in the CQ, that is, a queue depth, may be 32 by way of example. Also, the CQ may be implemented in a circular type which represents the start and end of a command string stored in the queue through a head pointer and a tail pointer, respectively.

Each of the plurality of memory units 221 may include a memory cell array (not shown) and a control circuit (not shown) which controls the operation of the memory cell array. The memory cell array may include a 2D memory cell array or a 3D memory cell array. The memory cell array includes a plurality of memory cells, and each of the memory cells may be a single level cell (SLC) which stores information of one bit or a cell which stores information of two or more bits such as a multilevel cell (MLC), a triple level cell (TLC), or a quadruple level cell (QLC). The 3D memory cell array may include a vertical NAND string which is vertically oriented so that at least one memory cell may be placed on another memory cell. This will be described in further detail below.

As power supply voltages, VCC, VCCQ1, VCCQ2, etc. may be input to the memory device 200. VCC is a main power supply voltage for the memory device 200 and may have a value of 2.4 V to 3.6 V. VCCQ1 is a power supply voltage for supplying a low range of voltage and mainly intended for the UFS device controller 210. For example, VCCQ1 may have a value of 1.14 V to 1.26 V. VCCQ2 is a power supply voltage for supplying a range of voltage which is lower than VCC but higher than VCCQ1 and mainly intended for an input/output interface such as the MIPI M-PHY 251. For example, VCCQ2 may have a value of 1.7 V to 1.95 V. The power supply voltages may be supplied to each element of the memory device 200 through the regulator 260. The regulator 260 may be implemented as a set of unit regulators each connected to the above-described power supply voltages.

Figure 5:
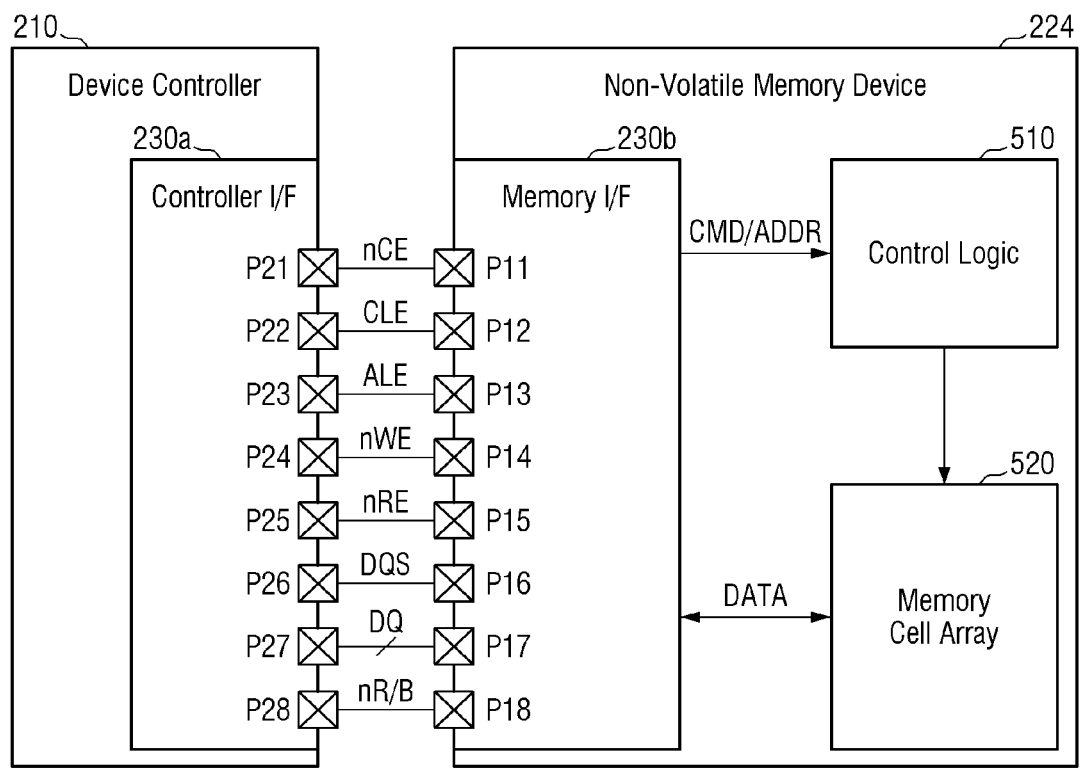
FIG. 5 is a diagram showing rearrangement of a universal flash storage (UFS) device controller, a storage interface, and a nonvolatile storage of FIG. 1.

FIG. 5 is a diagram showing rearrangement of the UFS device controller, the storage interface, and the nonvolatile storage of FIG. 1.

The storage interface 230 of FIG. 1 may include a controller interface circuit 230a and a memory interface circuit 230b. In some example embodiments, a storage device 224 shown in FIG. 5 may correspond to one storage unit 221 of FIG. 1. Also, in some example embodiments, the storage device 224 may correspond to the nonvolatile storage 220 of FIG. 1.

The storage device 224 may include first to eighth pins P11 to P18, a memory interface circuit 230b, a control logic circuit 510, and a memory cell array 520.

The memory interface circuit 230b may receive a chip enable signal nCE from the device controller 210 through the first pin P11. The memory interface circuit 230b may transmit and receive signals to and from the device controller 210 through the second to eighth pins P12 to P18 according to the chip enable signal nCE. For example, when the chip enable signal nCE is in an enable state (e.g., a low level), the memory interface circuit 230b may transmit and receive signals to and from the device controller 210 through the second to eighth pins P12 to P18.

The memory interface circuit 230b may receive a command latch enable signal CLE, an address latch enable signal ALE, and a write enable signal nWE from the device controller 210 through the second to fourth pins P12 to P14, respectively. Through the seventh pin P17, the memory interface circuit 230b may receive a data signal DQ from the device controller 210 or transmit the data signal DQ to the device controller 210. A command CMD, an address ADDR, and data may be transmitted through the data signal DQ. For example, the data signal DQ may be transmitted through a plurality of data signal lines. In this case, the seventh pin P17 may include a plurality of pins corresponding to a plurality of data signals.

The memory interface circuit 230b may acquire the command CMD from the data signal DQ received in an enable section (e.g., a high-level state) of the command latch enable signal CLE based on toggle timings of the write enable signal nWE. The memory interface circuit 230b may acquire the address ADDR from the data signal DQ received in an enable section (e.g., a high-level state) of the address latch enable signal ALE based on the toggle timings of the write enable signal nWE.

In some example embodiments, the write enable signal nWE may be maintained in a static state (e.g., the high level or the low level) and toggled between a high level and a low level. For example, the write enable signal nWE may be toggled in a section in which the command CMD or the address ADDR is transmitted. Accordingly, the memory interface circuit 230b may acquire the command CMD or the address ADDR based on the toggle timings of the write enable signal nWE.

The memory interface circuit 230b may receive a read enable signal nRE from the device controller 210 through the fifth pin P15. Through the sixth pin P16, the memory interface circuit 230b may receive a data strobe signal DQS from the device controller 210 or transmit the data strobe signal DQS to the device controller 210.

During an operation in which the storage device 224 outputs the data, the memory interface circuit 230b may receive the toggling read enable signal nRE through the fifth pin P15 before outputting the data. The memory interface circuit 230b may generate the toggling data strobe signal DQS based on toggling of the read enable signal nRE. For example, the memory interface circuit 230b may generate the data strobe signal DQS which starts to toggle after a predetermined delay (e.g., tDQSRE) based on a toggling start time of the read enable signal nRE. The memory interface circuit 230b may transmit the data signal DQ including the data DATA based on toggle timings of the data strobe signal DQS. Accordingly, the data DATA may be transmitted to the device controller 210 according to the toggle timings of the data strobe signal DQS.

During an operation in which the storage device 224 receives the data DATA, when the data signal DQ including the data DATA is received from the device controller 210, the memory interface circuit 230b may receive the toggling data strobe signal DQS together with the data DATA from the device controller 210. The memory interface circuit 230b may acquire the data DATA from the data signal DQ based on the toggle timings of the data strobe signal DQS. For example, the memory interface circuit 230b may acquire the data DATA by sampling the data signal DQ at rising edges and falling edges of the data strobe signal DQS.

The memory interface circuit 230b may transmit a ready/busy output signal nR/B to the device controller 210 through the eighth pin P18. The memory interface circuit 230b may transmit state information of the storage device 224 to the device controller 210 through the ready/busy output signal nR/B. When the storage device 224 is in a busy state (e.g., when internal operations of the storage device 224 are being performed), the memory interface circuit 230b may transmit the ready/busy output signal nR/B indicating the busy state to the device controller 210. When the storage device 224 is in a ready state (e.g., when internal operations of the storage device 224 are not being performed or have been completed), the memory interface circuit 230b may transmit the ready/busy output signal nR/B indicating the ready state to the device controller 210. As an example, while the storage device 224 is reading the data DATA from the memory cell array 520 in response to a page read command, the memory interface circuit 230b may transmit the ready/busy output signal nR/B indicating the busy state (e.g., a low level) to the device controller 210. As another example, while the storage device 224 is programming the data DATA into the memory cell array 520 in response to a program command, the memory interface circuit 230b may transmit the ready/busy output signal nR/B indicating the busy state to the device controller 210.

The control logic circuit 510 may, by and large, control the various operations of the storage device 224. The control logic circuit 510 may receive the acquired command CMD and the acquired address ADDR from the memory interface circuit 230b. The control logic circuit 510 may generate control signals for controlling other elements of the storage device 224 according to the received command CMD and address ADDR. For example, the control logic circuit 510 may generate various control signals for programming the data DATA into the memory cell array 520 or reading the data DATA from the memory cell array 520.

The memory cell array 520 may store the data DATA acquired from the memory interface circuit 230b according to control of the control logic circuit 510. The memory cell array 520 may output the stored data DATA to the memory interface circuit 230b according to control of the control logic circuit 510.

The memory cell array 520 may include a plurality of memory cells. For example, the plurality of memory cells may be flash memory cells. However, the disclosure is not limited thereto, and the memory cells may be RRAM cells, ferroelectric random access memory (FRAM) cells, PRAM cells, thyristor random access memory (TRAM) cells, or magnetic random access memory (MRAM) cells. Example embodiments of the disclosure will be described below, in which memory cells are NAND flash memory cells for purpose of description.

The device controller 210 may include first to eighth pins P21 to P28 and a controller interface circuit 230a. The first to eighth pins P21 to P28 may respectively correspond to the first to eighth pins P11 to P18 of the storage device 224.

The controller interface circuit 230a may transmit the chip enable signal nCE to the storage device 224 through the first pin P21. The controller interface circuit 230a may transmit and receive signals to and from the storage device 224 selected by the chip enable signal nCE through the second to eighth pins P22 to P28.

The controller interface circuit 230a may transmit the command latch enable signal CLE, the address latch enable signal ALE, and the write enable signal nWE to the storage device 224 through the second to fourth pins P22 to P24, respectively. Through the seventh pin P27, the controller interface circuit 230a may transmit the data signal DQ to the storage device 224 or receive the data signal DQ from the storage device 224.

The controller interface circuit 230a may transmit the data signal DQ including the command CMD or the address ADDR to the storage device 224 together with the toggling write enable signal nWE. Upon transmitting the command latch enable signal CLE having the enable state, the controller interface circuit 230a may transmit the data signal DQ including the command CMD to the storage device 224. Upon transmitting the address latch enable signal ALE having the enable state, the controller interface circuit 230a may transmit the data signal DQ including the address ADDR to the storage device 224.

The controller interface circuit 230a may transmit the read enable signal nRE to the storage device 224 through the fifth pin P25. Through the sixth pin P26, the controller interface circuit 230a may receive the data strobe signal DQS from the storage device 224 or transmit the data strobe signal DQS to the storage device 224.

During an operation in which the storage device 224 outputs the data DATA, the controller interface circuit 230a may generate the toggling read enable signal nRE and transmit the read enable signal to the storage device 224. For example, before the data DATA is output, the controller interface circuit 230a may generate the read enable signal nRE which is switched from a static state (e.g., a high level or low level) to a toggling state. Accordingly, the data strobe signal DQS which toggles based on the read enable signal nRE may be generated by the storage device 224. The controller interface circuit 230a may receive the data signal DQ including the data DATA from the storage device 224 together with the toggling data strobe signal DQS. The controller interface circuit 230a may acquire the data DATA from the data signal DQ based on toggle timings of the data strobe signal DQS.

During an operation in which the storage device 224 inputs the data DATA, the controller interface circuit 230a may generate the toggling data strobe signal DQS. For example, before transmitting the data DATA, the controller interface circuit 230a may generate the data strobe signal DQS which is switched from a static state (e.g., a high level or low level) to a toggling state. The controller interface circuit 230a may transmit the data signal DQ including the data DATA to the storage device 224 based on the toggle timings of the data strobe signal DQS.

The controller interface circuit 230a may receive the ready/busy output signal nR/B from the storage device 224 through the eighth pin P28. The controller interface circuit 230a may determine state information of the storage device 224 based on the ready/busy output signal nR/B.

Figure 6:
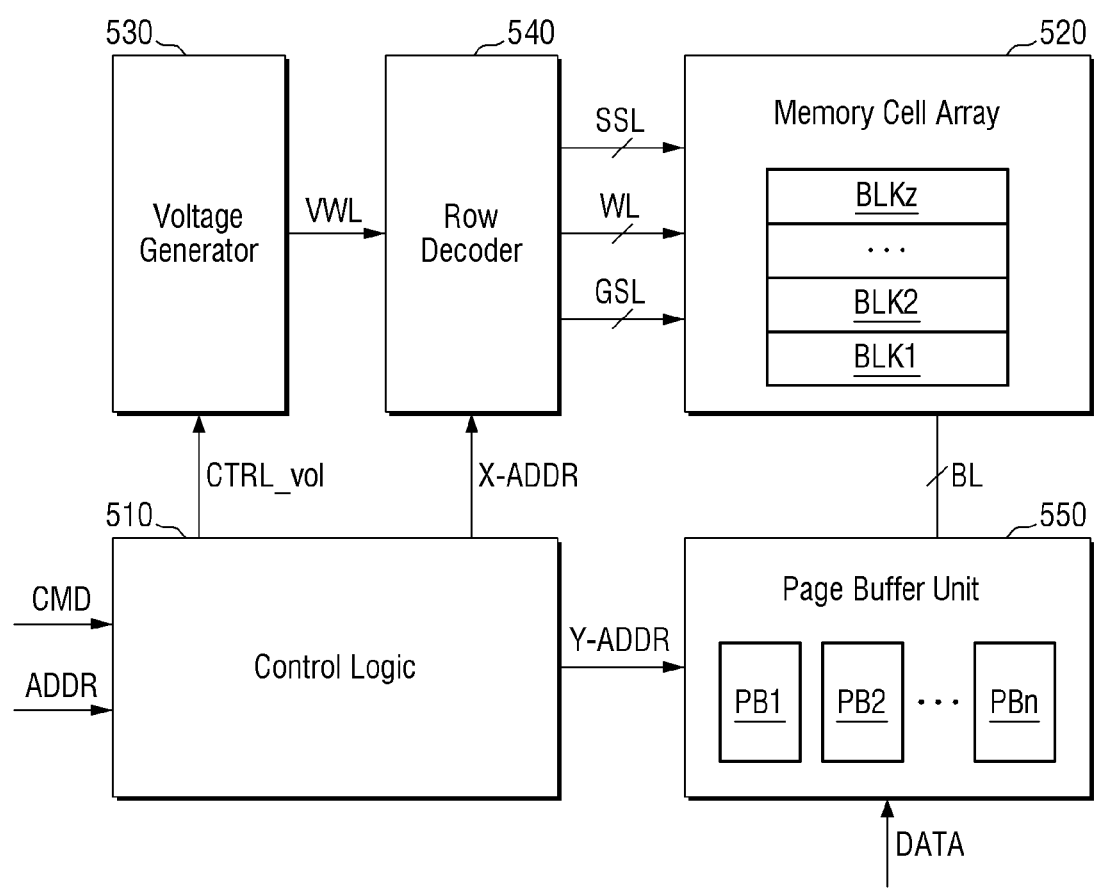
FIG. 6 is an example block diagram of a storage device of FIG. 5.

FIG. 6 is an example block diagram of the storage device of FIG. 5.

Referring to FIG. 6, the storage device 224 may include a control logic circuit 510, a memory cell array 520, a page buffer unit 550, a voltage generator 530, and a row decoder 540. Although not shown in FIG. 6, the storage device 224 may also include the memory interface circuit 230b shown in FIG. 5 and further include a column logic, a pre-decoder, a temperature sensor, a command decoder, an address decoder, and the like.

The control logic circuit 510 may, by and large, control the various operations in the storage device 224. The control logic circuit 510 may output various control signals in response to the command CMD and/or the address ADDR from the memory interface circuit 230b. For example, the control logic circuit 510 may output a voltage control signal CTRL vol, a row address X-ADDR, and a column address Y-ADDR.

The memory cell array 520 may include a plurality of memory blocks BLK1 to BLKz (z is a positive integer), and each of the plurality of memory blocks BLK1 to BLKz may include a plurality of memory cells. The memory cell array 520 may be connected to the page buffer unit 550 through bit lines BL and may be connected to the row decoder 540 through word lines WL, string select lines SSL, and ground select lines GSL.

In the example embodiment, the memory cell array 520 may include a 3D memory cell array which may include a plurality of NAND strings. Each of the NAND strings may include memory cells separately connected to word lines vertically stacked on a substrate. U.S. Pat. Nos. 7,679,133, 8,553,466, 8,654,587, and 8,559,235 and U.S. Patent Application Publication No. 2011/0233648 are herein incorporated by reference in their entireties. In the example embodiment, the memory cell array 520 may include a 2D memory cell array which may include a plurality of NAND strings disposed in row and column directions.

The page buffer unit 550 may include a plurality of page buffers PB1 to PBn (n is an integer greater than or equal to 3), and the plurality of page buffers PB1 to PBn may each be connected to one of the memory cells through the plurality of bit lines BL. The page buffer unit 550 may select at least one of the bit lines BL in response to the column address Y-ADDR. The page buffer unit 550 may operate as a write driver or a sense amplifier according to an operating mode. For example, in the case of a programming operation, the page buffer unit 550 may apply a bit line voltage corresponding to data to be programmed to a selected bit line. In the case of a read operation, the page buffer unit 550 may detect a current or a voltage of a selected bit line to read data stored in the memory cell.

The voltage generator 530 may generate various kinds of voltages for performing programming, read, and erase operations based on the voltage control signal CTRL vol. For example, the voltage generator 530 may generate a programming voltage, a read voltage, a program verification voltage, an erase voltage, etc. as word-line voltages VWL.

In response to the row address X-ADDR, the row decoder 540 may select one of the plurality of word lines WL and may select one of the plurality of string select lines SSL. For example, the row decoder 540 may apply the programming voltage and the program verification voltage to the selected word line in the case of a programming operation and may apply the read voltage to the selected word line in the case of a read operation.

Figure 7:
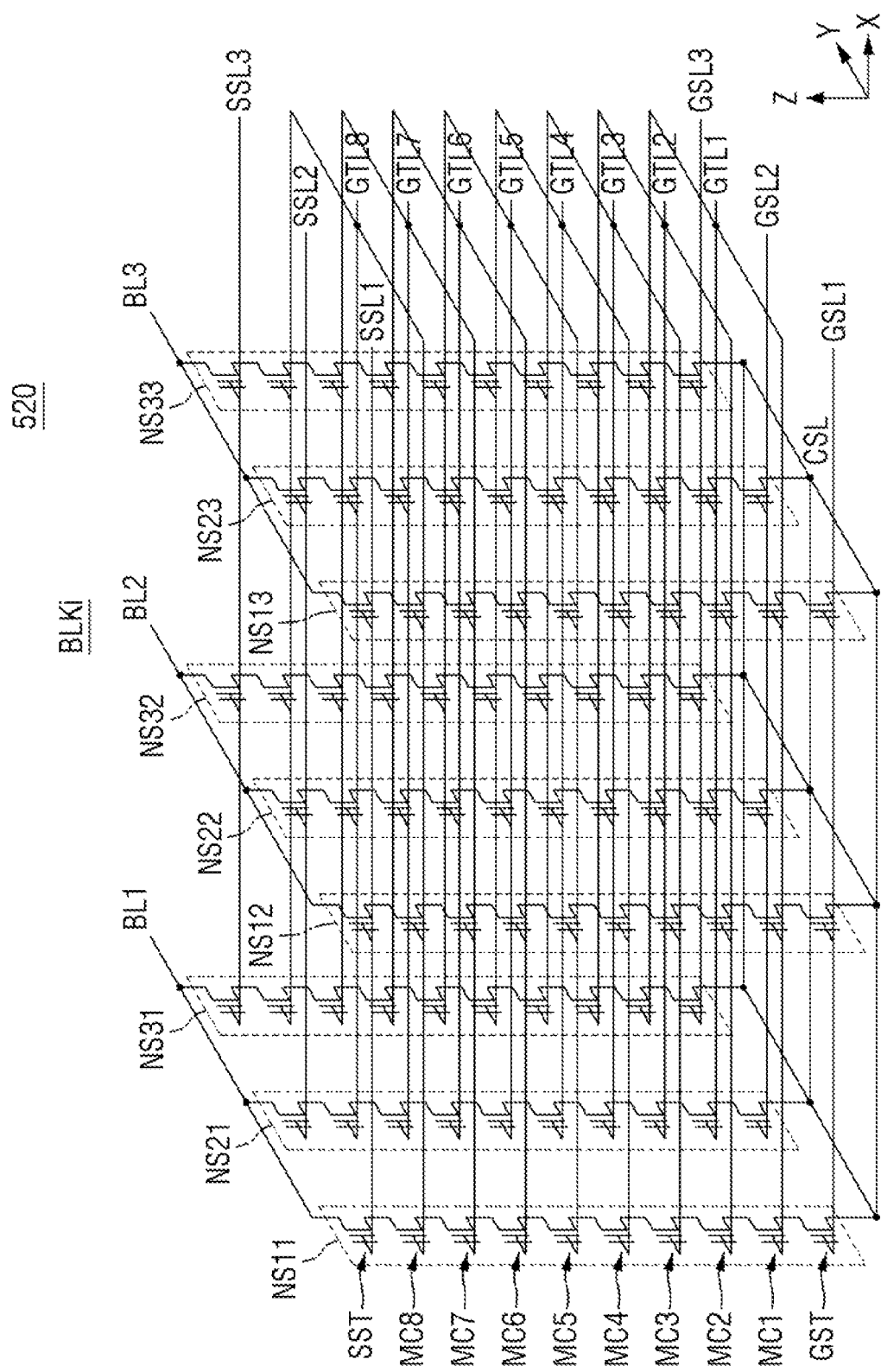
FIG. 7 is a diagram illustrating a three-dimensional (3D) vertical (V)-NAND structure according to some example embodiments.

FIG. 7 is a diagram illustrating a 3D V-NAND structure according to some example embodiments of the disclosure.

When a storage module of a UFS device is implemented as a 3D V-NAND flash memory, each of a plurality of memory blocks constituting the storage module may be represented as an equivalent circuit as shown in FIG. 7.

A memory block BLKi shown in FIG. 7 represents a 3D memory block formed in a 3D structure on a substrate. For example, a plurality of NAND memory strings included in the memory block BLKi may be formed in a direction perpendicular to the substrate.

Referring to FIG. 7, the memory block BLKi may include a plurality of NAND memory strings NS11 to NS33 connected between bit lines BL1, BL2, and BL3 and a common source line CSL. Each of the plurality of NAND memory strings NS11 to NS33 may include a string select transistor SST, a plurality of memory cells MC1, MC2, . . . , and MC8, and a ground select transistor GST. FIG. 7 shows that each of the plurality of NAND memory strings NS11 to NS33 includes eight memory cells MC1, MC2, . . . , and MC8, but the number of memory cells included in each of the plurality of NAND memory strings NS11 to NS33 is not limited thereto.

The string select transistor SST may be connected to a corresponding string select line SSL1, SSL2, or SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to word lines, and some of the gate lines GTL1, GTL2, . . . , and GTL8 may correspond to dummy word lines. The ground select transistor GST may be connected to a corresponding ground select line GSL1, GSL2, or GSL3. The string select transistor SST may be connected to a corresponding bit line BL1, BL2 or BL3, and the ground select transistor GST may be connected to the common source line CSL.

The memory cells at the same height may be connected in common to a word line (e.g., GTL1), and the ground select lines GSL1, GSL2, and GSL3 and the string select lines SSL1, SSL2, and SSL3 may be separated. Although FIG. 7 shows that the memory block BLKi is connected to the eight gate lines GTL1, GTL2, . . . , and GTL8 and the three bit lines BL1, BL2, and BL3, but the number and types of lines connected to the memory block BLKi are not limited thereto.

Figures 8, 9:
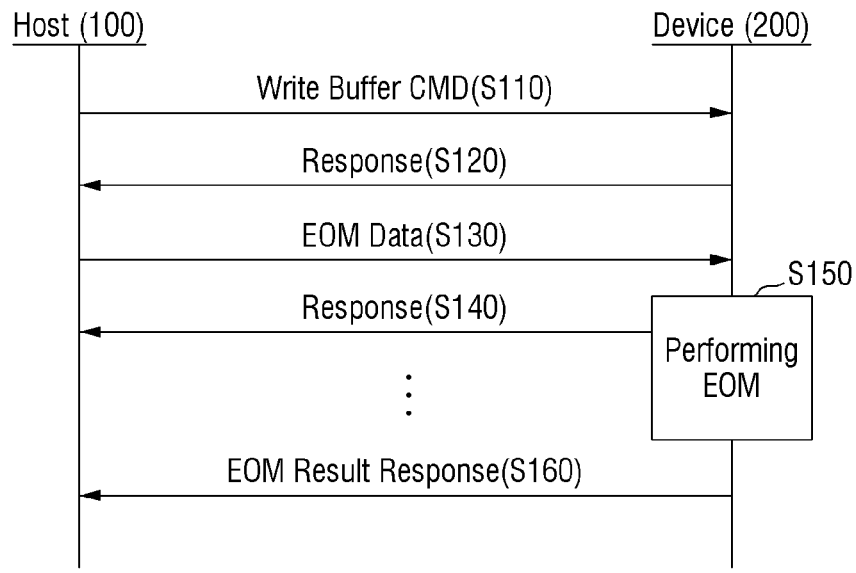

FIG. 8 is a sequence diagram illustrating an operation of a memory system according to some example embodiments of the disclosure. FIGS. 9 to 14 are diagrams illustrating the operation of the memory system according to some example embodiments of the disclosure.

Referring to FIG. 8, the host device 100 transmits a request command for performing an EOM operation to the memory device 200 (S110).

In some example embodiments, the request command may be implemented in the form of a write buffer command of FIG. 9 conforming to the JEDEC UFS standard. FIG. 9 is a diagram showing a command descriptor block (CDB) of a write buffer command, and FIG. 10 is a diagram showing description of "MODE" field setting values of a write buffer command.

Specifically, referring to FIGS. 1, 9, and 10, the UFS host controller 110 of the host device 100 may request the UFS device controller 210 of the memory device 200 to perform an EOM operation by setting a "MODE" field of a write buffer command to 1F. The UFS device controller 210 receiving the write buffer command may prepare for an EOM operation.

In some example embodiments, operations of the UFS host controller 110 and operations of the UFS device controller 210 may be performed when the UFS host controller 110 and the UFS device controller 210 are controlled by certain firmware, but example embodiments are not limited thereto.

FIG. 10 shows an example embodiment of requesting an EOM operation when a setting value of the "MODE" field in the write buffer command is 1F, but example embodiments are not limited to the illustrated example. In an embodiment, the setting value of the "MODE" field for requesting an EOM operation may be changed to other setting values, such as 1D and 1E, which are set to "Reserved" in the standard specifications.

Referring to FIGS. 1 and 9, the UFS host controller 110 may transmit the size of EOM data, which will be described later, to the UFS device controller 210 using a "PARAMETER LIST LENGTH" field of the write buffer command.

Subsequently, referring to FIG. 8, the memory device 200 transmits a response to the write buffer command to the host device 100 (S120).

In some example embodiments, the response may include information on the amount of data which is receivable in one unit by the memory device 200. In other words, when the memory device 200 transmits k (k is a natural number) bytes to the host device 100 as a response, the host device 100 may thereafter transmit data (e.g., data to be used for performing the EOM operation) to the memory device 200 in units of k bytes.

Subsequently, referring to FIG. 8, the host device 100 transmits generated EOM data to the memory device 200 (S130), and the memory device 200 transmits a response to reception of the EOM data to the host device 100 (S140).

In an example embodiment, the host device 100 may generate EOM data to be used for the EOM operation to be performed in the memory device 200.

The EOM data may be generated before the host device 100 transmits a request command for performing the EOM operation to the memory device 200 (S110) or after the host device 100 receives the response to the write buffer command from the memory device 200 (S120).

Also, in some example embodiments, the EOM data may be generated at a time point between a time point when the host device 100 transmits a request command for performing the EOM operation to the memory device 200 (S110) and a time point when the host device 100 receives the response to the write buffer command from the memory device 200 (S120). The timing at which the host device 100 generates the EOM data to be used in the EOM operation that is performed by the memory device 200 may be changed without limitations.

In some example embodiments, the EOM data generated by the host device 100 may include parameters for performing the EOM operation and pattern data for performing the EOM operation.

In some example embodiments, the parameters for performing the EOM operation may include offset values dX and dY which are used by the EOM 251a of the memory device 200 to perform the operations described above with reference to FIGS. 3 and 4.

The offset value dX may include a time offset value, a phase offset value, etc., and the offset value dY may include a voltage offset value, etc., but example embodiments are not limited thereto.

Also, parameters for performing the EOM operation may include phase resolution information. The phase resolution information may be used by the memory device 200 to receive pattern data from the host device 100.

In some example embodiments, the pattern data for performing the EOM operation may be a signal S which is used by the EOM 251a of the memory device 200 to perform the operations described above with reference to FIGS. 3 and 4 and provided by the host device 100.

In some example embodiments, the host device 100 may generate a plurality of pieces of pattern data. The plurality of pieces of pattern data may be generated by using a combination of many bit sequences and consistent results of performing an EOM operation may be generated based on the data patterns.

Examples of such pattern data may be pseudorandom binary sequence (PRBS) data, compliant random test pattern (CRPAT) data, compliant jitter tolerance pattern (CJTPAT) data, etc., but example embodiments are not limited thereto.

FIG. 11 is a diagram showing a structure of EOM data transmitted by the host device 100 to the memory device 200 according to some example embodiments.

Referring to FIG. 11, EOM data may include an EOM data header EDH and EOM data patterns EDP.

The EOM data header EDH may include parameters for performing an EOM operation. For example, a "PHASE SELECT" field may include an offset value to be transmitted to the memory device 200 or a phase offset value, and a "REFERENCE VOLTAGE CONTROL (VREF CONTROL)" field may include a voltage offset value to be transmitted to the memory device 200.

In other words, a time offset value or a phase offset value, which is used by the memory device 200 to perform the EOM operation described above with reference to FIGS. 3 and 4, may be provided from the host device 100 to the memory device 200 through the "PHASE SELECT" field. Also, a voltage offset value, which is used by the memory device 200 to perform the EOM operation described above with reference to FIGS. 3 and 4, may be provided from the host device 100 to the memory device 200 through a "VREF CONTROL" field.

The phase resolution information (or gear information) that the memory device 200 consults to receive pattern data from the host device 100 may be provided from the host device 100 to the memory device 200 through a "PHASE RESOLUTION" field.

The number of samplings performed by the memory device 200 during the EOM operation may be provided from the host device 100 to the memory device 200 through a "NUMBER OF SAMPLING" field.

Also, the size of pattern data to be received by the memory device 200 from the host device 100 may be provided from the host device 100 to the memory device 200 through an "EOM DATA LENGTH" field.

Although FIG. 11 shows an example of the EOM data header EDH having 12 bytes, example embodiments are not limited thereto, and the size of the EOM data header EDH may be changed without limitations.

The EOM data patterns EDP may include pattern data for performing the EOM operation. As shown in FIG. 11, the EOM data patterns EDP may include a plurality of pieces of pattern data. In some example embodiments, N shown in FIG. 11 may be a natural number greater than 12.

Figure 12:
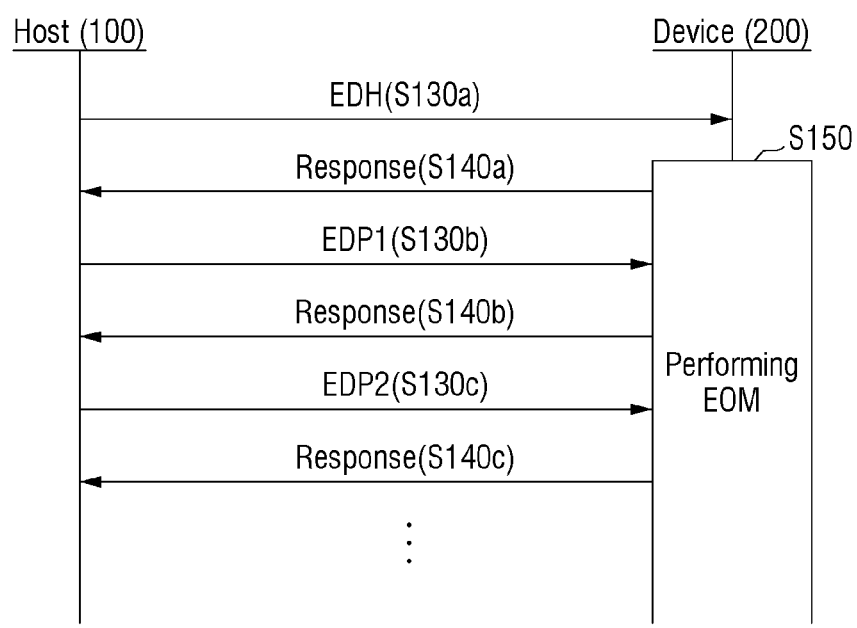

Referring to FIG. 12, the EOM data header EDH and the EOM data patterns EDP may be transmitted from the host device 100 to the memory device 200 over multiple times. In this case, when the host device 100 determines a method of transmitting the EOM data header EDH and the EOM data patterns EDP to the memory device 200, the receivable data amount information (or information on the amount of data that is receivable in one unit), which may be included in a response transmitted from the memory device 200 to the host device 100 in operation S120 of FIG. 8, may be taken into consideration.

For example, when the receivable data amount information, which is included in a response transmitted from the memory device 200 to the host device 100 in operation S120 of FIG. 8, is 12 bytes, the host device 100 may transmit the EOM data header EDH and the EOM data patterns EDP to the memory device 200 in a way illustrated in FIG. 12.

Specifically, the host device 100 first transmits the EOM data header EDH having a size of 12 bytes to the memory device 200 (S130a). Then, the memory device 200 acknowledges the host device 100 that the EOM data header EDH has been received (S140a).

Subsequently, the host device 100 transmits one of the EOM data patterns EDP (e.g., EOM data pattern EDP1) having a size of 12 bytes to the memory device 200 (S130b). Then, the memory device 200 acknowledges the host device 100 that the EOM data pattern EDP1 has been received (S140b). The host device 100 transmits a subsequent one of the EOM data patterns EDP (e.g., EOM data pattern EDP2) having a size of 12 bytes to the memory device 200 (S130c). Then, the memory device 200 acknowledges the host device 100 that the EOM data pattern EDP2 has been received (S140c). By repeating the above operations, all of the EOM data patterns shown in FIG. 11 may be provided from the host device 100 to the memory device 200.

A structure of EOM data transmitted from the host device 100 to the memory device 200 is not limited to the example shown in FIG. 11.

FIG. 13 is a diagram showing a structure of EOM data transmitted by the host device 100 to the memory device 200 according to some other example embodiments.

Referring to FIG. 13, EOM data may include an EOM data header EDH and an EOM data pattern EDP.

The EOM data header EDH may include parameters for performing an EOM operation.

For example, a "Timing Offset" field and a "Timing Step" field may include a time offset value or a phase offset value to be transmitted to the memory device 200, and a "Voltage Offset" field and a "Voltage Step" field may include a voltage offset value to be transmitted to the memory device 200.

In other words, a time offset value and/or a phase offset value, which is used by the memory device 200 to perform the EOM operation described above with reference to FIGS. 3 and 4, may be provided from the host device 100 to the memory device 200 through the "Timing Offset" field and/or the "Timing Step" field. Also, a voltage offset value, which is used by the memory device 200 to perform the EOM operation described above with reference to FIGS. 3 and 4, may be provided from the host device 100 to the memory device 200 through the "Voltage Offset" field and/or the "Voltage Step" field.

In other words, in an example embodiment, the offset value dX and the offset value dY shown in FIGS. 3 and 4 may not be displayed as one value as shown in the example embodiment of FIG. 11 and may be instead displayed in two fields of a reference value (e.g., a reference phase or a reference voltage) and an offset value (e.g., an offset phase value or an offset voltage value) with respect to the reference value.

The number of samplings performed by the memory device 200 during the EOM operation may be provided from the host device 100 to the memory device 200 through the "Number of Sampling" field.

Also, the size of pattern data to be received by the memory device 200 from the host device 100 may be provided from the host device 100 to the memory device 200 through a "Total Data Length" field.

Referring back to FIG. 8, the memory device 200 that receives the EOM data performs the EOM operation (S150).

In some example embodiments, an EOM operation may be performed while an EOM data pattern (e.g., EDP of FIG. 12) is being received after an EOM data header (e.g., EDH of FIG. 12) is received. However, example embodiments are not limited thereto, and an EOM operation may be performed after all EOM data patterns (e.g., EDP of FIG. 12) are received.

Referring to FIGS. 1 to 4, the EOM 251a may perform the operations described above with reference to FIGS. 3 and 4 every time a piece of pattern data is received from the host device 100. In other words, the EOM 251*a* may output an error count signal EC and a sampling count signal SC for each piece of received pattern data.

The sampling count signal SC may be used in determining whether the number of samplings in the "NUMBER OF SAMPLING" field provided from the host device 100 to the memory device 200 is equal to the number of samplings performed by the memory device 200.

The error count signal EC may be used in calculating an error count value corresponding to a phase offset value provided through the "PHASE SELECT" field and a voltage offset value provided through the "VREF CONTROL" field regarding all pattern data received from the host device 100.

For example, the host device 100 may transmit 100 pieces of pattern data for the memory device 200 to perform an EOM operation, and the EOM 251*a* may output 30 error count signals EC after the 100 pieces of pattern data are received. In this case, an error count value resulting from the EOM operation may be 30. The error count value may be used in calculating an error rate (in this example, 30%).

Referring back to FIG. 8, the memory device 200 which has performed the EOM operation transmits a response signal including a result of performing the EOM operation to the host device 100 (S160).

In this case, the response signal may include information on whether the EOM operation has been successfully performed and an error count value corresponding to a phase offset value and a voltage offset value.

For example, when the number of samplings in the "NUMBER OF SAMPLING" field provided from the host device 100 to the memory device 200 is equal to a value of the sampling count signal SC output by the EOM 251*a* of the memory device 200, the memory device 200 may determine that the EOM operation has been completely performed and transmit complete information to the host device 100.

On the other hand, when the number of samplings in the "NUMBER OF SAMPLING" field provided from the host device 100 to the memory device 200 is different from a value of the sampling count signal SC output by the EOM 251*a* of the memory device 200, the memory device 200 may determine that the EOM operation has not been completely performed and transmit failure information to the host device 100.

In some example embodiments, information on whether the EOM operation has been successfully performed may be provided to the host device 100 through, for example, a "Response" field shown in FIG. 14, but example embodiments are not limited thereto.

Also, in some example embodiments, the above-described error count value may be provided to the host device 100 through, for example, four sense data fields Sense Data[0], Sense Data[1], Sense Data[2], and Sense Data[3] shown in FIG. 14, but example embodiments are not limited thereto.

A result of performing the EOM operation generated in this way may be consulted and used in changing a signal driving characteristic of the host device 100 or a signal reception characteristic of the memory device 200.

The above-described memory system according to example embodiments does not require an external device to detect quality characteristics of a signal transmitted and received between the host device 100 and the memory device 200. Further, a signal line through which an EOM operation is performed is identical to a signal line through which the host device 100 and the memory device 200 actually transmit and receive signals. Accordingly, it is possible to easily perform a reliable EOM operation.

Figure 15:
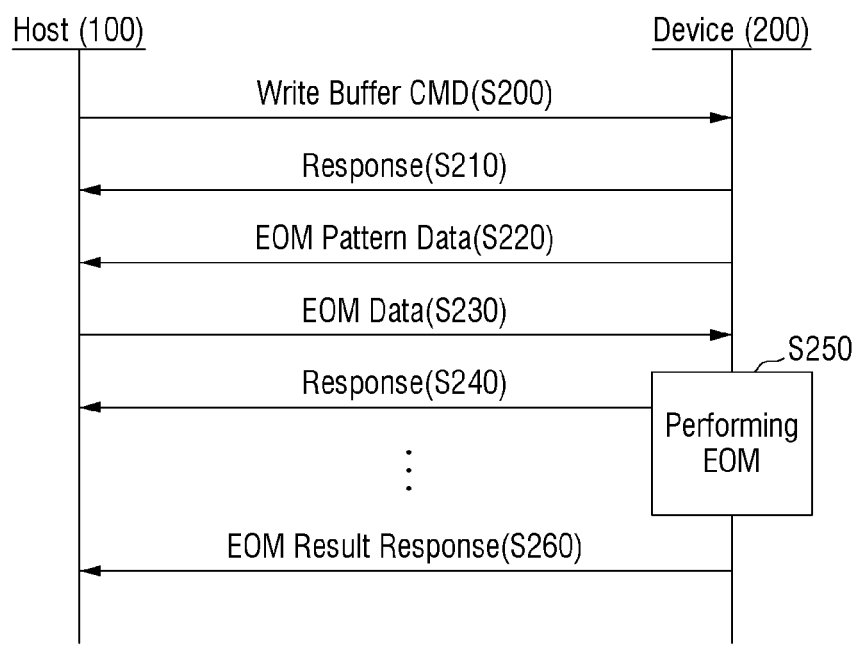
FIG. 15 is a sequence diagram illustrating an operation of a memory system according to some example embodiments.

FIG. 15 is a sequence diagram illustrating an operation of a memory system according to some other example embodiments of the disclosure.

Descriptions overlapping with the above-described embodiments will be omitted below, and differences will be mainly described.

Referring to FIG. 15, a host device 100 transmits a request command for performing an EOM operation to a memory device 200 (S200). Then, the memory device 200 transmits a response to the write buffer command to the host device 100 (S210).

Subsequently, the memory device 200 transmits pattern data for performing the EOM operation to the host device 100 (S220).

Referring to FIG. 1, in some example embodiments, the pattern data for performing the EOM operation may be stored in the nonvolatile memory 220 of the memory device 200 and transmitted to the host device 100, but example embodiments are not limited thereto.

In an example embodiment, unlike the example embodiment described above with reference to FIG. 8, the host device 100 does not generate pattern data for performing the EOM operation, and pattern data stored in the memory device 200 is used in performing the EOM operation.

Subsequently, the host device 100 transmits EOM data including parameters for performing the EOM operation and the pattern data received from the memory device 200 to the memory device 200 (S230). Then, the memory device 200 transmits a response to reception of the EOM data to the host device 100 (S240). The memory device 200 receiving the EOM data performs the EOM operation (S250), and the memory device 200 which has performed the EOM operation transmits a response signal including a result of performing the EOM operation to the host device 100 (S260).

Figure 16:
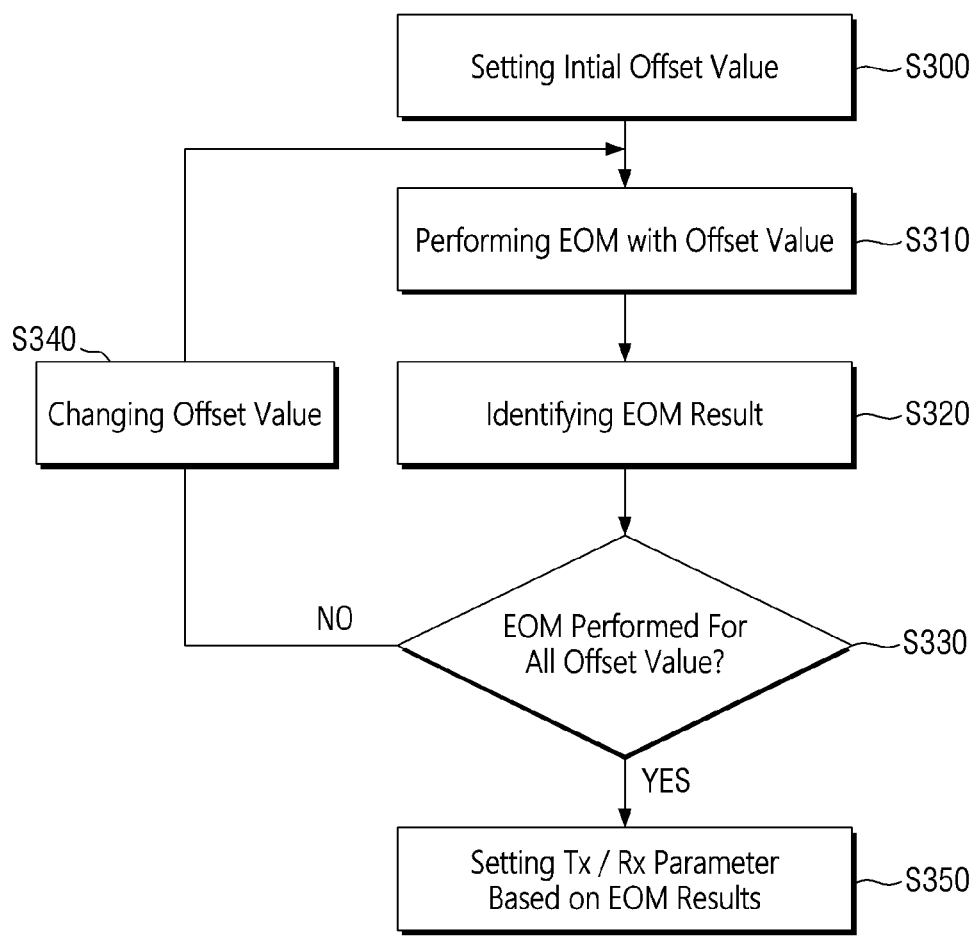
FIG. 16 is a flowchart illustrating an operation of a memory system according to some example embodiments.

FIG. 16 is a flowchart illustrating an operation of a memory system according to still some other example embodiments of the disclosure.

Referring to FIG. 16, an initial offset value is set (S300).

For example, referring to FIGS. 1 and 11, the host device 100 may set offset values to be included in the EOM data header EDH (e.g., a value to be included in the "PHASE SELECT" field and/or a value to be included in the "VREF CONTROL" field).

Subsequently, an EOM operation is performed for the set offset value (S310). Then, an EOM result is identified (S320).

For example, the host device 100 and the memory device 200 may perform an EOM operation through the operations described above with reference to FIG. 8 or 15 and identify the result.

When the EOM operation has not been performed for all offset values ('NO' in S330), the offset values are changed (S340). Then, the EOM operation is performed (S310), and the result is identified (S320). In other words, the EOM operation may be performed for a sufficient number of offset values to detect quality characteristics of a signal transmitted and received between the host device 100 and the memory device 200.

When the EOM operation has been performed for all the offset values ('YES' in S330), parameters for a transmitting terminal and a receiving terminal of the host device 100 and the memory device 200 are set based on the EOM result (S350).

For example, the host device 100 may set a parameter related to signal driving or reception based on the EOM result, and the memory device 200 may also set a parameter related to signal driving or reception. However, example embodiments are not limited thereto.

While the disclosure has been described with reference to example embodiments thereof, it will be apparent to those of ordinary skill in the art that various changes and modifications may be made thereto without departing from the spirit and scope of the disclosure as set forth in the following claims.

What is claimed is:

1. A method of operating a host device, the method comprising:
    transmitting, by the host device, a request command for performing an eye-opening monitor (EOM) operation to a memory device;
    transmitting, by the host device, at least one parameter for performing the EOM operation to the memory device;
    transmitting, by the host device, pattern data for performing the EOM operation to the memory device; and
    receiving, by the host device, a first response signal including a result of the EOM operation performed based on the at least one parameter and the pattern data from the memory device,
    wherein the EOM operation is performed based on a comparison between a main path signal, which corresponds to a signal received from the host device and restored at the memory device, and an EOM path signal, which corresponds to a signal received from the host device and restored using an offset value at the memory device, and
    wherein the at least one parameter for performing the EOM operation includes a parameter that defines the offset value.

2. The method of claim 1, wherein the request command for performing the EOM operation includes a write buffer command.

3. The method of claim 2, wherein a "MODE" field of the write buffer command is set to 1F.

4. The method of claim 1, further comprising receiving, by the host device, a second response signal from the memory device in response to the request command for performing the EOM operation,
    wherein the second response signal includes information on an amount of data receivable in one unit at the memory device, and
    the at least one parameter and the pattern data are transmitted to the memory device based on the information on the amount of data receivable in one unit at the memory device.

5. The method of claim 1, wherein the at least one parameter includes at least one of a time offset value, a phase offset value, and a voltage offset value.

6. The method of claim 5, wherein the first response signal includes least one of information on whether the EOM operation has been successfully performed and an error count value obtained according to the EOM operation.

7. The method of claim 1, further comprising generating, by the host device, the pattern data for performing the EOM operation.

8. The method of claim 1, further comprising, prior to the transmitting the pattern data:
    receiving, by the host device, the pattern data for performing the EOM operation from the memory device.

9. A method of operating a memory device, the method comprising:
    receiving, by the memory device, a request command for performing an eye-opening monitor (EOM) operation from a host device;
    receiving, by the memory device, at least one parameter for performing the EOM operation from the host device;
    receiving, by the memory device, pattern data for performing the EOM operation from the host device; and
    performing, by the memory device, the EOM operation based on the at least one parameter and the pattern data and transmitting a first response signal including a result of performing the EOM operation to the host device,
    wherein the performing the EOM operation comprises performing the EOM operation based on a comparison between a main path signal, which corresponds to a signal received from the host device and restored at the memory device, and an EOM path signal, which corresponds to a signal received from the host device and restored using an offset value at the memory device, and
    wherein the at least one parameter for performing the EOM operation includes a parameter that defines the offset value.

10. The method of claim 9, wherein the request command for performing the EOM operation includes a write buffer command.

11. The method of claim 10, wherein a "MODE" field of the write buffer command is set to 1F.

12. The method of claim 9, further comprising transmitting, by the memory device, a second response signal to the host device in response to the request command for performing the EOM operation,
    wherein the second response signal includes information on an amount of data receivable in one unit from the host device, and
    the at least one parameter and the pattern data are received from the host device based on the information on the amount of data receivable in one unit from the host device.

13. The method of claim 9, wherein the at least one parameter includes at least one of a time offset value, a phase offset value, and a voltage offset value.

14. The method of claim 13, wherein the first response signal includes at least one of information on whether the EOM operation has been successfully performed and an error count value obtained according to the EOM operation.

15. The method of claim 9, wherein the pattern data is generated in the host device and received by the memory device.

16. The method of claim 9, further comprising, prior to the receiving the pattern data:
    transmitting, by the memory device, the pattern data to the host device.

17. A memory system comprising:
    a host device including a host controller; and
    a memory device including a device controller and an eye-opening monitor (EOM),
    wherein the host controller is configured to transmit a request command for performing an EOM operation to the memory device, transmit at least one parameter for performing the EOM operation to the memory device, transmit pattern data for performing the EOM operation to the memory device, and receive a first response signal including a result of the EOM operation performed based on the at least one parameter and the pattern data from the memory device, wherein the EOM operation is performed based on a comparison between a main path signal, which corresponds to a signal received from the host device and restored at the memory device, and an EOM path signal, which corresponds to a signal received from the host device and restored using an offset value at the memory device, and wherein the at least one parameter for performing the EOM operation includes a parameter that defines the offset value.

18. The memory system of claim 17, wherein the EOM is included in a universal flash storage (UFS) interconnect (UIC) layer of the memory device.

19. The memory system of claim 18, wherein the UIC layer further includes a special function register (SFR), and
the at least one parameter and the pattern data are stored in the SFR.

20. The memory system of claim 17, wherein the request command for performing the EOM operation includes a write buffer command of which a "MODE" field is set to 1F.

21. The method of claim 5, wherein the at least one parameter further includes phase resolution information.

* * * * *